United States Patent
Provin et al.

(12)

(10) Patent No.: US 11,554,539 B2
(45) Date of Patent: Jan. 17, 2023

(54) PHOTOCURABLE COMPOSITION FOR THREE-DIMENSIONAL STEREOLITHOGRAPHY AND THREE-DIMENSIONAL OBJECT

(71) Applicants: NIKON CORPORATION, Tokyo (JP); ESSILOR INTERNATIONAL, Charenton-le-Pont (FR)

(72) Inventors: Christophe Provin, Kawasaki (JP); Akiko Miyakawa, Sagamihara (JP)

(73) Assignees: NIKON CORPORATION, Tokyo (JP); ESSILOR INTERNATIONAL, Charenton-le-Pont (FR)

(*) Notice: Subject to any disclaimer, the term of this patent is extended or adjusted under 35 U.S.C. 154(b) by 381 days.

(21) Appl. No.: 16/627,955

(22) PCT Filed: Jul. 28, 2017

(86) PCT No.: PCT/JP2017/027412
§ 371 (c)(1),
(2) Date: Dec. 31, 2019

(87) PCT Pub. No.: WO2019/021453
PCT Pub. Date: Jan. 31, 2019

(65) Prior Publication Data
US 2020/0180214 A1   Jun. 11, 2020

(51) Int. Cl.
*C08F 2/46* (2006.01)
*C08F 2/50* (2006.01)
*C08G 61/04* (2006.01)
*B29C 64/129* (2017.01)
*B33Y 80/00* (2015.01)
*G03F 7/00* (2006.01)
*B33Y 70/00* (2020.01)

(52) U.S. Cl.
CPC ............ *B29C 64/129* (2017.08); *B33Y 70/00* (2014.12); *B33Y 80/00* (2014.12); *G03F 7/0037* (2013.01)

(58) Field of Classification Search
CPC ......... B33Y 10/00; B33Y 80/00; B33Y 70/00; C08F 222/102; C08F 222/103; C08F 222/1025; C08F 220/306; C08F 220/30; C08F 220/301; C08F 226/12; C09D 4/00; G03F 7/031; G03F 7/027; G03F 7/0005; G03F 7/2012; G03F 7/0037
USPC ................ 522/33, 6, 189, 184, 71, 1; 520/1
See application file for complete search history.

(56) References Cited

U.S. PATENT DOCUMENTS

| | | | |
|---|---|---|---|
| 7,868,109 B2 | 1/2011 | Samukawa et al. | |
| 2005/0151271 A1* | 7/2005 | Tatsuzawa | H01L 23/4828 428/209 |
| 2014/0287219 A1* | 9/2014 | Hayashida | G02B 1/10 522/39 |

FOREIGN PATENT DOCUMENTS

| | | | |
|---|---|---|---|
| JP | H03-227222 A | | 10/1991 |
| JP | 2011-013601 | * | 1/2011 |
| JP | 2011-13601 A | | 1/2011 |
| JP | 2011-028801 | * | 2/2011 |
| JP | 2011-028801 A | | 2/2011 |

OTHER PUBLICATIONS

Koo, JP 2011-013601 Machine Translation, Jan. 20, 2011 (Year: 2011).*
Hayashibe et al, JP 2011-028801 Machine Translation, Feb. 10, 2011 (Year: 2011).*
Oct. 24, 2017 International Search Report issued in International Patent Application No. PCT/JP2017/027412.
Feb. 16, 2021 Extended Search Report issued in European Patent Application No. 17919175.4.
Jan. 28, 2020 International Preliminary Report on Patentability issued in International Patent Application No. PCT/JP2017/027412.

* cited by examiner

*Primary Examiner* — Jessica Whiteley
(74) *Attorney, Agent, or Firm* — Oliff PLC (57) ABSTRACT

A photocurable composition for three-dimensional stereolithography which has a lower viscosity and from which a cured product having a high refractive index is obtained, and a three-dimensional object formed by using the composition. The composition is a photocurable composition for three-dimensional stereolithography containing a fluorene monomer, a carbazole monomer, a diluent monomer, and a photopolymerization initiator, the carbazole monomer being contained in an amount of less than 30 wt % with respect to the total amount of the fluorene monomer and the carbazole monomer, and the diluent monomer being contained in an amount of at least 20 wt % with respect to total solids.

18 Claims, 1 Drawing Sheet

PHOTOCURABLE COMPOSITION FOR THREE-DIMENSIONAL STEREOLITHOGRAPHY AND THREE-DIMENSIONAL OBJECT

TECHNICAL FIELD

The present disclosure relates to a photocurable composition for three-dimensional stereolithography and a three-dimensional object.

BACKGROUND ART

A method of forming a photocurable composition into a three-dimensional shape through three-dimensional stereolithography (hereinafter also referred to simply as "stereolithography") has recently been studied as a method capable of manufacturing a three-dimensional object with good dimensional accuracy without using a mold (e.g., PTL 1). According to this method, a plurality of layers are stacked on top of each other to manufacture a three-dimensional object. More specifically, after a three-dimensional object model is divided into a large number of two-dimensional cross-sectional layers, cross-sectional members corresponding to the respective two-dimensional cross-sectional layers are successively formed using a photocurable composition and successively stacked on top of each other to form a three-dimensional object.

CITATION LIST

Patent Literature

[PTL 1] JP 3-227222 A

SUMMARY OF INVENTION

The present disclosure relates to a photocurable composition for three-dimensional stereolithography containing a fluorene monomer, a carbazole monomer, a diluent monomer, and a photopolymerization initiator, the carbazole monomer being contained in an amount of less than 30 wt % with respect to the total amount of the fluorene monomer and the carbazole monomer, and the diluent monomer being contained in an amount of at least 20 wt % with respect to total solids.

The present disclosure also relates to a three-dimensional object formed by using the photocurable composition for three-dimensional stereolithography.

DESCRIPTION OF EMBODIMENTS

A photocurable composition for three-dimensional stereolithography and a three-dimensional object are described below in detail with reference to embodiments.

In the specification, a hyphen (-) is used to mean that numerical values before and after the hyphen are included as a lower limit value and an upper limit value, respectively.

In the specification, (meth)acrylate represents acrylate or methacrylate; (meth)acryloyl group represents acryloyl group or methacryloyl group; (meth)acryloyloxy group represents acryloyloxy group or methacryloyloxy group; and (meth)acrylamide group represents acrylamide group or methacrylamide group.

Each ingredient contained in the photocurable composition for three-dimensional stereolithography according to this embodiment may be used as a single ingredient or as a mixture of two or more types. When each ingredient is composed of a mixture of two or more types, its content refers to a total content unless otherwise specified.

According to the stereolithography, for example, as illustrated in FIG. 1 to FIG. 4 to be referred to later, formation of a liquid layer made of a photocurable composition and its curing are repeatedly performed to integrally stack a plurality of cured layers to thereby manufacture a sterically stacked object (three-dimensional object). When the photocurable composition has a high viscosity, liquid layers cannot be formed promptly and a three-dimensional object cannot be manufactured efficiently. When the photocurable composition has a high viscosity, liquid layers cannot be reduced in thickness. Therefore, a three-dimensional object having a compact shape cannot be manufactured. Accordingly, the photocurable composition is required to have a low viscosity to apply the stereolithography to the photocurable composition. When the three-dimensional object is used for an optical element or the like, a cured product of the photocurable composition is also required to have a high refractive index.

Conventional techniques could not provide the above-mentioned photocurable composition which has a low viscosity and from which a cured product having a high refractive index is obtained. Therefore, a photocurable composition having the above-mentioned properties has been desired.

In the photocurable composition for three-dimensional stereolithography according to this embodiment, a fluorene monomer and a carbazole monomer which are high refractive index materials are used in combination at a specified weight ratio, and the amount of a diluent monomer in total solids is adjusted to be equal to or larger than a specified amount in terms of viscosity. Therefore, a low viscosity of the photocurable composition for three-dimensional stereolithography and a high refractive index of the cured product are deemed to be achieved simultaneously at an extremely high level. The "photocurable composition for three-dimensional stereolithography" is hereinafter also referred to simply as "photocurable composition" or "composition."

The composition according to this embodiment is first described below in detail, and a three-dimensional object formed using the composition according to this embodiment is then described in detail.

(1) Photocurable Composition for Three-Dimensional Stereolithography

As described above, the composition according to this embodiment contains a fluorene monomer, a carbazole monomer, a diluent monomer, and a photopolymerization initiator. The carbazole monomer is contained in an amount of less than 30 wt % with respect to the total amount of the fluorene monomer and the carbazole monomer, and the diluent monomer is contained in an amount of at least 20 wt % with respect to the total solids.

Respective ingredients contained in the photocurable composition are described below in detail.

1. Fluorene Monomer

The fluorene monomer contained in the composition according to this embodiment is not particularly limited as long as a monomer having a fluorene structure (structure shown below) is used. The fluorene monomer is deemed to mainly contribute to enhancement of the refractive index of a cured product.

Fluorene Structure

[Chem.1]

<Polymerizable Group>

The fluorene monomer has at least one polymerizable group. The number of polymerizable groups contained in the fluorene monomer is preferably 1-5 and more preferably 2 because the composition has a lower viscosity, and the cured product obtained has a higher refractive index, a higher glass transition point, a higher hardness, and improved transparency.

Note that a simple term "more excellent properties" used herein is to be understood to mean, relating to the composition according to this embodiment, that "the composition has a lower viscosity, and the cured product obtained has a higher refractive index, a higher glass transition point, a higher hardness, and improved transparency." The type of the polymerizable group is not particularly limited, and specific examples thereof include a radical polymerizable group and a cationic polymerizable group. Examples of the radical polymerizable group include (meth)acryloyl group, (meth)acryloyloxy group, itaconic acid ester group, crotonic acid ester group, isocrotonic acid ester group, maleic acid ester group, vinyl group, (meth)acrylamide group, styryl group and allyl group. Examples of the cationic polymerizable group include epoxy group, oxetanyl group, and vinyloxy group.

The polymerizable group is preferably a radical polymerizable group and more preferably a (meth)acryloyloxy group because of more excellent properties.

<Preferred Mode>

The fluorene monomer is preferably a compound represented by formula (F1) shown below because of more excellent properties.

[Chem.2]

(F1)

In formula (F1) shown above, $Ar_1$ and $Ar_2$ each independently represent an aromatic hydrocarbon group which may have a substituent, provided that at least one of $Ar_1$ and $Ar_2$ has a group containing a polymerizable group (polymerizable group-containing group) as a substituent.

The aromatic hydrocarbon group is not particularly limited, and is preferably an aromatic hydrocarbon group containing 6-30 carbon atoms, and more preferably an aromatic hydrocarbon group containing 6-20 carbon atoms because of more excellent properties. Specific examples of a ring making up the aromatic hydrocarbon group include a benzene ring, a naphthalene ring, an anthracene ring, a phenanthrene ring, a fluorene ring, a triphenylene ring, a pyrene ring, a naphthacene ring, a biphenyl ring (two phenyl groups may be linked together by any linking mode), and a terphenyl ring (three phenyl groups may be linked together by any linking mode). A benzene ring is particularly preferred because of more excellent properties.

Specific examples and preferred modes of the polymerizable group contained in the polymerizable group-containing group are the same as described above. The polymerizable group-containing group may be a group only consisting of a polymerizable group.

The polymerizable group-containing group is preferably a group represented by formula (P) shown below because of more excellent properties.

$$*\text{-L-P} \tag{P}$$

In formula (P) shown above, L represents a single bond or a divalent linking group.

The divalent linking group may be, for example, a divalent aliphatic hydrocarbon group (which may be linear, branched or cyclic, and preferably contains 1-20 carbon atoms, specific examples thereof including an alkylene group, an alkenylene group, and an alkynylene group), a divalent aromatic hydrocarbon group, —O—, —S—, —SO$_2$—, —NR$_a$—, —CO—, —N=N—, —CH=N—, and a combination group of two or more thereof. $R_a$ as used herein represents a hydrogen atom or an alkyl group. Specific examples of a ring making up the divalent aromatic hydrocarbon group are the same as described above.

In formula (P) shown above, P represents a polymerizable group. Specific examples of the polymerizable group are as described above. In particular, the polymerizable group is preferably a radical polymerizable group and more preferably a (meth)acryloyloxy group because of more excellent properties.

In formula (P) shown above, * represents a bonding position.

$Ar_1$ and $Ar_2$ may contain a substituent X shown below as an exemplary substituent other than the polymerizable group-containing group.

The substituent X in the specification is not particularly limited, and examples thereof include an alkyl group (an alkyl group containing 1-11 carbon atoms, such as a methyl group, an ethyl group, a propyl group, a butyl group, a pentyl group, a hexyl group, a heptyl group, an octyl group, a nonyl group, a decyl group and an undecyl group, a 2-ethylhexyl group, and the like), a cycloalkyl group (including a bicycloalkyl group and a tricycloalkyl group), an alkenyl group, a cycloalkenyl group, a 1-pentenyl group, a bicycloalkenyl group, an alkynyl group (including a 1-pentynyl group, a trimethylsilylethynyl group, a triethylsilylethynyl group, a tri-i-propylsilylethynyl group, and a 2-p-propylphenylethynyl group), a cycloalkynyl group, an aryl group (including an aryl group containing 6-20 carbon atoms such as a phenyl group, a naphthyl group, a p-pentylphenyl group, a 3,4-dipentylphenyl group, a pheptoxyphenyl group, and a 3,4-diheptoxyphenyl group), a heterocyclic group (namely, a hetero ring group, including a 2-hexylfuranyl group), a cyano group, a hydroxy group, a nitro group, an acyl group (including a hexanoyl group, and a benzoyl group), an alkoxy group (including a butoxy group), an aryloxy group, a silyloxy group, a heterocyclic oxy group, an acyloxy group, a carbamoyloxy group, an amino group (including an anilino group), an acylamino group, an aminocarbonylamino group (including a ureido group), alkoxy- and aryloxycarbonylamino groups, alkyl- or cyloalkyl- and arylsulfonylamino groups, a mercapto group, alkyl- or cycloalkyl- and arylthio groups (including a methylthio group and an octylthio group), a heterocyclic thio group, a sulfamoyl group, a sulfo group, alkyl- or cycloalkyl- and arylsulfinyl groups, alkyl- or cycloalkyl- and arylsulfonyl groups, alkyl- or cycloalkyl- and aryloxycarbonyl groups, a carbamoyl group, an aryl- and a heterocyclic azo group, an imido group, a phosphino group, a phosphinyl group, a phosphinyloxy group, a phosphinylamino group, a phosphono group, a silyl group, a hydrazino group, and other known substituents. The substituents may further be substituted with any such group.

The compound represented by formula (F1) shown above may further have a substituent (for example, the above-mentioned substituent X) in addition to the substituents that $Ar_1$ and $Ar_2$ may have.

The compound represented by formula (F1) shown above is preferably a compound represented by formula (F2) shown below because of more excellent properties.

[Chem.3]

(F2)

In formula (F2) shown above, $R_1$ and $R_2$ each represent a polymerizable group-containing group. Specific examples and preferred modes of the polymerizable group-containing group are as described above.

In formula (F2) shown above, m and n each independently represent an integer of 0-5, provided that m and n satisfy the relation: m+n is equal to or larger than 1.

In formula (F2) shown above, m and n are each preferably 1 because of more excellent properties.

The compound represented by formula (F2) shown above may further have a substituent (for example, the above-mentioned substituent X).

The compound represented by formula (F2) shown above is preferably 9,9-bis[4-(2-acryloyloxyethoxy)phenyl]fluorene because of more excellent properties.

<Content>

The fluorene monomer content of the composition according to this embodiment is preferably 10-60 wt %, more preferably 20-50 wt % and even more preferably 30-40 wt % with respect to total monomers because of more excellent properties.

The fluorene monomer content of the composition according to this embodiment is preferably 10-60 wt %, more preferably 20-50 wt % and even more preferably 30-40 wt % with respect to the total solids because of more excellent properties.

The term "total solids" as used in the specification refers to all ingredients other than solvents (except an alcohol when the alcohol is contained as an anti-yellowing agent).

2. Carbazole Monomer

The carbazole monomer contained in the composition according to this embodiment is not particularly limited as long as a monomer having a carbazole structure (structure shown below) is used. The carbazole monomer is deemed to mainly contribute to enhancing the refractive index of the cured product obtained while decreasing the viscosity of the composition.

Carbazole Structure

[Chem.4]

<Polymerizable Group>

The carbazole monomer has at least one polymerizable group. The number of polymerizable groups contained in the carbazole monomer is preferably 1-5 and more preferably 1 because of more excellent properties.

Specific examples of the polymerizable group are the same as described above. In particular, the polymerizable group is preferably a radical polymerizable group and more preferably a vinyl group because of more excellent properties.

<Preferred Mode>

The carbazole monomer is preferably a compound represented by formula (C1) shown below because of more excellent properties.

[Chem.5]

(C1)

In formula (C1) shown above, $R_1$ represents a group containing a polymerizable group (polymerizable group-containing group). The polymerizable group-containing group may be a group only consisting of a polymerizable group.

Specific examples of the polymerizable group contained in the polymerizable group-containing group are as described above. In particular, the polymerizable group is preferably a radical polymerizable group and more preferably a vinyl group because of more excellent properties.

The polymerizable group-containing group is preferably a group represented by formula (P) shown above because of more excellent properties.

P in formula (P) shown above is preferably a radical polymerizable group and more preferably a vinyl group because of more excellent properties.

The compound represented by formula (C1) shown above may further have a substituent (for example, the above-mentioned substituent X).

The compound represented by formula (C1) shown above is preferably 9-vinylcarbazole because of more excellent properties.

<Content>

The carbazole monomer content of the composition according to this embodiment is preferably 1-25 wt %, more preferably 2-20 wt % and even more preferably 5-15 wt % with respect to the total monomers because of more excellent properties.

The carbazole monomer content of the composition according to this embodiment is preferably 1-25 wt %, more preferably 2-20 wt % and even more preferably 5-15 wt % with respect to the total solids because of more excellent properties.

3. C/(F+C)

The above-mentioned carbazole monomer content with respect to the total content of the above-mentioned fluorene monomer and the above-mentioned carbazole monomer in the composition according to this embodiment (hereinafter also referred to as "C/(F+C)") is less than 30 wt %. An extremely good balance is struck between the viscosity of the composition and the refractive index of the resulting cured product by adjusting the fluorene monomer content and the carbazole monomer content so as to attain the above-mentioned specified relation.

C/(F+C) is preferably up to 25 wt % because of more excellent properties. The lower limit is not particularly limited, and is preferably at least 5 wt %, more preferably at least 10 wt % and even more preferably at least 15 wt % because of more excellent properties.

4. (F+C)/(Total Monomers)

The total content of the above-mentioned fluorene monomer and the above-mentioned carbazole monomer in the composition according to this embodiment is preferably up to 80 wt % with respect to the total monomers because of more excellent properties.

The total content of fluorene monomer and carbazole monomer in the composition with respect to the total monomers (hereinafter also referred to as "(F+C)/(total monomers)") is preferably 10-70 wt % and more preferably 30-60 wt % because of more excellent properties. In particular, (F+C)/(total monomers) is preferably at least 46 wt % because of lower viscosities. (F+C)/(total monomers) is preferably up to 49 wt % because a more adhesive and tougher three-dimensional object can be manufactured.

The total content of the above-mentioned fluorene monomer and the above-mentioned carbazole monomer in the composition according to this embodiment is preferably 10-70 wt % and more preferably 30-60 wt % with respect to the total solids because of more excellent properties.

5. Diluent Monomer

The diluent monomer contained in the composition according to this embodiment is a monomer other than the above-mentioned fluorene monomer and the above-mentioned carbazole monomer, and is a monomer having one or two polymerizable groups. In other words, the diluent monomer is a monomer in which the above-mentioned fluorene structure and carbazole structure are both not included, and is a monomer having one or two polymerizable groups. The diluent monomer is deemed to mainly serve to decrease the viscosity of the composition.

<Polymerizable Group>

As described above, the diluent monomer has one or two polymerizable groups.

Specific examples of the polymerizable group are the same as described above. In particular, the polymerizable group is preferably a radical polymerizable group and more preferably a (meth)acryloyloxy group because of more excellent properties.

<First Preferred Mode>

As described above, the diluent monomer preferably has a (meth)acryloyloxy group because of more excellent properties. Examples of the (meth)acryloyloxy group-containing diluent monomer include (meth)acrylic acid, methyl (meth)acrylate, ethyl (meth)acrylate, butyl (meth)acrylate, isobutyl (meth)acrylate, t-butyl (meth)acrylate, cyclohexyl (meth)acrylate, tetrahydrofurfuryl (meth)acrylate, 2-ethylhexyl (meth)acrylate, dodecyl (meth)acrylate, isononyl (meth)acrylate, isodecynonyl (meth)acrylate, stearyl (meth)acrylate, 2-hydroxyethyl (meth)acrylate, 2-hydroxypropyl (meth)acrylate, 2-hydroxybutyl (meth)acrylate, isobornyl (meth)acrylate, butoxy diethylene glycol (meth)acrylate, benzyl (meth)acrylate, dicyclohexyl (meth)acrylate, 2-dicyclohexyloxyethyl (meth)acrylate, phenoxyethyl (meth)acrylate, dimethylaminoethyl (meth)acrylate, ethylene glycol di(meth)acrylate, 1,4-butanediol di(meth)acrylate, neopentyl glycol di(meth)acrylate, 1,6-hexanediol di(meth)acrylate, nonanediol di(meth)acrylate, tris(2-(meth)acryloyloxyethyl)isocyanurate, 2-morpholinoethyl (meth)acrylate, 9-anthryl (meth)acrylate, 2,2-bis(4-(meth)acryloyloxyphenyl)propane, trans-1,4-cyclohexanediol di(meth)acrylate, dicyclopentenyloxyethyl (meth)acrylate, phenoxy benzyl (meth)acrylate, ethoxylated o-phenylphenol (meth)acrylate, and tricyclodecane dimethanol di(meth)acrylate.

<Second Preferred Mode>

The diluent monomer is preferably a compound represented by formula (D1) shown below because of more excellent properties.

$$W\text{-}L\text{-}P \tag{D1}$$

In formula (D1) shown above, W represents an alicyclic hydrocarbon group or an aromatic hydrocarbon group. The compound represented by formula (D1) shown above has an alicyclic hydrocarbon group or an aromatic hydrocarbon group, and therefore has a comparatively high refractive index.

The alicyclic hydrocarbon group may be monocyclic or polycyclic. Examples of the monocyclic alicyclic hydrocarbon group include monocyclic cycloalkyl groups such as cyclopentyl group, cyclohexyl group, and cyclooctyl group. Examples of the polycyclic alicyclic hydrocarbon group include polycyclic cycloalkyl groups such as norbornyl group, tricyclodecanyl group, tetracyclodecanyl group, tetracyclododecanyl group, isobornyl group, and adamantyl group.

Specific examples of the aromatic hydrocarbon group are the same as those of $Ar_1$ and $Ar_2$ in formula (F1) shown above. It is to be noted that fluorenyl group is excluded.

In formula (D1) shown above, L represents a single bond or a divalent linking group.

Specific examples of the divalent linking group are the same as those of L in formula (P) shown above.

In formula (D1) shown above, P represents a polymerizable group. Specific examples of the polymerizable group are the same as those of P in formula (P) shown above. In particular, the polymerizable group is preferably a radical polymerizable group and more preferably a (meth)acryloyloxy group because of more excellent properties.

In formula (D1) shown above, W, L, and P may each have a substituent (for example, the above-mentioned substituent X). The substituent is preferably a hydroxy group because of more excellent properties.

The compound represented by formula (D1) shown above is preferably benzyl acrylate, ethoxylated o-phenylphenol acrylate, 2-hydroxy-4-phenoxypropyl acrylate, or isobornyl acrylate, and more preferably benzyl acrylate, ethoxylated o-phenylphenol acrylate, or 2-hydroxy-4-phenoxypropyl acrylate because of more excellent properties.

<Refractive Index>

The refractive index of the diluent monomer is preferably at least 1.40, more preferably at least 1.47 and even more preferably at least 1.50 because of more excellent properties. The upper limit is not particularly limited and is usually up to 1.58.

When two or more types of diluent monomers are contained, because of more excellent properties, the refractive index of at least one diluent monomer is preferably within the above-mentioned range, and the refractive index of all the diluent monomers is more preferably within the above-mentioned range.

The refractive index of the diluent monomer is the refractive index of a cured product of the diluent monomer alone (at a wavelength of 594 nm). The refractive index is measured using 2010M Prism Coupler manufactured by Metricon Corporation.

<Viscosity>

Because of more excellent properties, the diluent monomer preferably has a viscosity of up to 500 mPa·s, more preferably up to 200 mPa·s, even more preferably up to 100 mPa·s, and particularly preferably up to 10 mPa·s.

The lower limit of the viscosity of the diluent monomer is not particularly limited, and is preferably at least 1 mPa·s because of more excellent properties.

When two or more types of diluent monomers are contained, because of more excellent properties, the viscosity of at least one diluent monomer is preferably within the above-mentioned range, and the viscosity of all the diluent monomers is more preferably within the above-mentioned range.

In the specification, the viscosity is measured at 25° C. using a viscometer (VM-10A manufactured by Sekonic Corporation).

<Content>

The diluent monomer content of the composition according to this embodiment is at least 20 wt % with respect to the total solids. The viscosity of the composition can be considerably reduced by adjusting the diluent monomer content within the above-mentioned range. As described above, the term "total solids" refers to all ingredients other than solvents (except an alcohol when the alcohol is contained as an anti-yellowing agent described later).

Because of more excellent properties, the diluent monomer content with respect to the total solids (hereinafter referred to also as "D/(total solids)") is preferably at least 30 wt %, more preferably at least 40 wt % and even more preferably at least 44 wt %. The upper limit of D/(total solids) is not particularly limited, and is preferably up to 90 wt %, more preferably up to 80 wt %, even more preferably up to 70 wt % and particularly preferably up to 60 wt % because of more excellent properties.

When the fluorene monomer and the carbazole monomer are contained in a total amount of 30-80 wt % with respect to total monomers, D/(total solids) is preferably up to 70 wt % and more preferably up to 60 wt % because of more excellent properties.

Because of more excellent properties, the diluent monomer content of the composition according to this embodiment is preferably at least 30 wt %, more preferably at least 40 wt % and even more preferably at least 44 wt % with respect to the total monomers. The upper limit is not particularly limited, and is preferably up to 90 wt %, more preferably up to 80 wt %, even more preferably up to 70 wt % and particularly preferably up to 60 wt % because of more excellent properties.

Two or more types of diluent monomers are preferably used in combination because of more excellent properties.

Because of more excellent properties, a compound (1-1) and a compound (1-2) as described below are preferably used in combination as the diluent monomers in the composition according to this embodiment.

Compound (1-1): the above-mentioned compound represented by formula (D1) (when W in formula (D1) is a phenyl group).

Compound (1-2): the above-mentioned compound represented by formula (D1) (when W in formula (D1) is a biphenyl group).

Because of more excellent properties, a compound (1) and a compound (2) as described below are preferably used in combination as the diluent monomers in the composition according to this embodiment.

Compound (1): the above-mentioned compound represented by formula (D1) (when no substituent is included).

Compound (2): the above-mentioned compound represented by formula (D1) (when a hydroxy group is included as the substituent) (2-hydroxy-4-phenoxypropyl acrylate is preferred because of more excellent properties).

6. Photopolymerization Initiator

The photopolymerization initiator contained in the composition according to this embodiment is not particularly limited, but a known photopolymerization initiator may be used. Examples of the photopolymerization initiator include alkylphenone photopolymerization initiators (e.g., IRGACURE 651 manufactured by BASF SE), methoxyketone photopolymerization initiators, acylphosphine oxide photopolymerization initiators, hydroxyketone photopolymerization initiators (e.g., IRGACURE 184 manufactured by BASF SE; 1,2-alpha-hydroxyalkylphenone), aminoketone photopolymerization initiators (e.g., 2-methyl-1-[4-(methylthio)phenyl]-2-morpholino-propan-1-one (IRGACURE 907 manufactured by BASF SE) and IRGACURE 369 manufactured by BASF SE), and oxime photopolymerization initiators.

<Preferred Mode>

Because of more excellent properties, the photopolymerization initiator is preferably an acylphosphine oxide photopolymerization initiator (hereinafter also referred to simply as "specific initiator").

The specific initiator has the photobleaching function that causes photofading through light irradiation. Therefore, when a step B to be described later is performed, portions colored by the specific initiator are discolored (photobleached) by the photobleaching function of the specific initiator to obtain a three-dimensional object having excellent transparency.

Examples of the acylphosphine oxide photopolymerization initiator include a monoacylphosphine oxide photopolymerization initiator and a bisacylphosphine oxide photopolymerization initiator.

Examples of the monoacylphosphine oxide photopolymerization initiator include 2,4,6-trimethylbenzoyl-diphenylphosphine oxide (IRGACURE TPO manufactured by BASF SE) and 2,4,6-trimethylbenzoyl-phenylethoxyphosphine oxide.

Examples of the bisacylphosphine oxide photopolymerization initiator include bis(2,4,6-trimethylbenzoyl)-phenylphosphine oxide (IRGACURE 819 manufactured by BASF SE) and bis(2,6-dimethoxybenzoyl)-2,4,4-trimethylpentylphosphine oxide.

Because of more excellent properties, the photopolymerization initiator is also preferably a high refractive index photopolymerization initiator containing an aromatic ring and a sulfur atom. Examples of the high refractive index photopolymerization initiator include thioxanthen-9-one and 2,4-diethyl-9H-thioxanthen-9-one (DETX).

<Content>

Because of more excellent properties, the photopolymerization initiator content of the composition according to this embodiment is preferably 0.01-10 wt %, more preferably 0.1-5 wt % and even more preferably 0.5-3 wt % with respect to the total solids.

7. Other Ingredients

The composition according to this embodiment may contain ingredients other than the above-mentioned ingredients. Such ingredients are illustrated below.

<Organic Additive for Improving Refractive Index>

The composition according to this embodiment preferably contains an organic additive for improving the refractive index because a cured product has a higher refractive index.

Examples of the organic additive for improving the refractive index include phenanthrene and benzoquinoline.

The content of the organic additive for improving the refractive index in the composition according to this embodiment is not particularly limited, and is preferably 1 30 wt % with respect to the total solids because of more excellent properties.

<Anti-Yellowing Agent>

The composition according to this embodiment preferably contains an anti-yellowing agent because the transparency and the durability of a cured product are improved.

Examples of the anti-yellowing agent include hindered amine light stabilizers (HALS) (in particular, 1,2,2,6,6-pentamethyl-4-piperidyl methacrylate), and alcohols (in particular, 3-methyl-2-buten-1-ol).

The content of the hindered amine light stabilizer in the composition according to this embodiment is not particularly limited, and is preferably 0.001-0.5 wt % with respect to the total solids because of more excellent properties.

The content of the alcohol in the composition according to this embodiment is not particularly limited, and is preferably 0.1-2 wt % with respect to the total solids because of more excellent properties.

<Ultraviolet Light or Visible Light Absorber>

The composition according to this embodiment preferably contains an ultraviolet light or visible light absorber because the curability in the depth direction is easily controlled.

Examples of the ultraviolet light or visible light absorber include Tinuvin 477, Tinuvin 384-2, and Tinuvin 928 manufactured by BASF SE.

The ultraviolet light or visible light absorber content of the composition according to this embodiment is not particularly limited, and is preferably 0.1-3 wt % with respect to the total solids because of more excellent properties.

<Crosslinker>

The composition according to this embodiment preferably contains a crosslinker because of more excellent properties.

The crosslinker is a compound having three or more polymerizable groups. Specific examples of the polymerizable group are the same as described above. In particular, the polymerizable group is preferably a radical polymerizable group and more preferably a (meth)acryloyloxy group because of more excellent properties.

The upper limit of the number of polymerizable groups contained in a crosslinkable group is not particularly limited, and is preferably up to 10 and more preferably up to 5 because of more excellent properties.

Because of more excellent properties, the crosslinker is preferably trimethylolpropane tri(meth)acrylate, pentaerythritol tetra(meth)acrylate, dipentaerythritol hexa(meth)acrylate, or pentaerythritol triacrylate, and more preferably trimethylolpropane tri(meth)acrylate.

The crosslinker content of the composition according to this embodiment is not particularly limited, and is preferably 0.1-10 wt % and more preferably 0.5-5 wt % with respect to the total solids because of more excellent properties.

<Inorganic Additive>

The composition according to this embodiment preferably contains an inorganic additive because a cured product has a higher refractive index.

Examples of the inorganic additive include zinc sulfide (ZnS), zirconium oxide ($ZrO_2$) and titanium oxide ($TiO_2$).

The inorganic additive is usually in the form of nanoparticles (having a particle size of, for example, 1-50 nm).

The inorganic additive content of the composition according to this embodiment is not particularly limited, and is preferably 1-20 wt % and more preferably 2-10 wt % with respect to the total solids because of more excellent properties.

<Solvent>

The composition according to this embodiment is preferably substantially free of solvents other than the above-mentioned alcohol used as the anti-yellowing agent, in terms of storage performance, safety, and environment. The solvents do not include any polymerizable group-containing compounds.

The expression "substantially free of solvents" means that the solvent content of the composition is up to 10 wt % with respect to the total weight of the composition, and the solvent content is preferably up to 5 wt %, more preferably up to 3 wt %, even more preferably up to 1 wt %, and particularly preferably 0 wt %.

<Halogen>

The composition according to this embodiment is preferably substantially free of halogens.

The expression "substantially free of halogens" means that the halogen content of the composition is up to 10 wt % with respect to the total weight of the composition, and the halogen content is preferably up to 5 wt %, more preferably up to 3 wt %, even more preferably up to 1 wt %, and particularly preferably 0 wt %.

<Other Additives>

The composition according to this embodiment may contain other additives. Examples of such additives include an age inhibitor, a film adjusting agent, an antioxidant, a coloration preventing agent, a filler, and an internal mold release agent.

8. Method of Preparing Composition

The method of preparing the composition according to this embodiment is not particularly limited but a known method may be used. For example, the composition can be prepared by mixing the above-mentioned respective ingredients and then stirring the mixture with a known device.

9. Properties

Preferred properties of the composition according to this embodiment are described below.

<Refractive Index>

In terms of application to optical elements and the like, the refractive index of the composition according to this embodiment is preferably at least 1.60, and more preferably at least 1.62. The upper limit is not particularly limited and is usually up to 1.65.

The refractive index of the composition is the refractive index of a cured product of the composition (at a wavelength of 594 nm). The refractive index is measured using 2010M Prism Coupler manufactured by Metricon Corporation.

<Glass Transition Point>

The glass transition point (Tg) of the composition according to this embodiment is preferably 50° C. or higher. The upper limit is not particularly limited and is usually 100° C. or lower.

Tg of the composition is Tg of a cured product of the composition.

Tg is measured using differential scanning calorimetry (DSC). More specifically, DSC 8500 (PerkinElmer, Inc.) is used to decrease the temperature of a measurement sample to −50° C. at a temperature decrease rate of −10° C./min. When the temperature of the measurement sample reaches −50° C., the temperature is kept for 10 minutes, and is then increased to 150° C. at a temperature increase rate of 10° C./min. This operation is repeated twice and an inflection point on a specific heat curve in the second temperature increase is regarded as the glass transition temperature.

<Viscosity>

The viscosity of the composition according to this embodiment is preferably up to 900 mPa·s and more preferably up to 500 mPa·s because a liquid layer is easily reduced in thickness (to 100 micrometers or less, for example), and as a result, a three-dimensional object having a compact shape is easily manufactured. The lower limit is not particularly limited, and is preferably at least 10 mPa·s in terms of ease of handling. The viscosity measurement method is as described above.

<Hardness>

The hardness of the composition according to this embodiment is preferably at least HDD 75. The upper limit is not particularly limited and is usually up to HDD 100.

The hardness of the composition is the Shore D hardness of a cured product of the composition, and the Shore D hardness is measured according to JIS K7215 using a durometer (HH336 manufactured by Mitutoyo Corporation).

<Transmittance>

In terms of application to optical elements and the like, the transmittance of the composition according to this embodiment is preferably at least 85%.

The transmittance of the composition is the transmittance of a cured product (thickness: 2 mm) of the composition (at a wavelength of 420-800 nm), and the transmittance is measured using a spectrophotometer U4100 (Hitachi High-Technologies Corporation).

10. Application

The composition according to this embodiment is advantageously used to manufacture three-dimensional objects through stereolithography.

(2) Three-Dimensional Object

Next, a three-dimensional object according to an embodiment is described.

The three-dimensional object according to this embodiment is a three-dimensional object formed using the above-mentioned composition according to the embodiment.

1. Method of Manufacturing Three-Dimensional Object

While the method of manufacturing the three-dimensional object according to this embodiment is not particularly limited, because of higher shape accuracy of the resulting three-dimensional object, a method is preferably used in which a step A1 for forming a liquid layer of the photocurable composition and a step A2 for forming a cured layer through selective irradiation of the liquid layer with light are repeated in this order to manufacture a stacked object having a plurality of cured layers stacked on top of each other (this process is hereinafter referred to also as "step A").

<Step A>

Procedures of the step A are described by way of example using FIG. 1 to FIG. 4. FIG. 1 to FIG. 4 are schematic side views illustrating the respective procedures (respective steps) of the step A.

Figure 1:
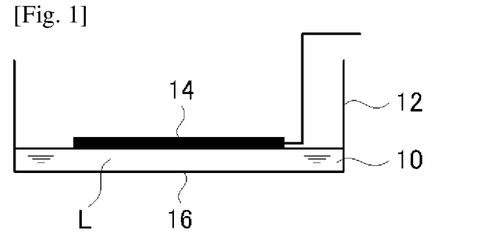
FIG. 1 is a view illustrating a procedure of a step A1 in a three-dimensional object-manufacturing method.

First, as illustrated in FIG. 1, a liquid tank 12 containing a liquid photocurable composition 10 is prepared. The material of the liquid tank 12 is not particularly limited as long as a light transmissive material is used. Specific examples thereof include glass and resin.

A forming stage 14 capable of moving up and down is provided inside the liquid tank 12 at such a position as to have a predetermined height (for example, 1-500 micrometers, and preferably 5-100 micrometers) from a bottom surface 16 of the liquid tank 12. A liquid layer L of the photocurable composition is thus formed between a lower surface of the forming stage 14 and the bottom surface 16 of the liquid tank 12 (corresponding to the step A1).

Figure 2:
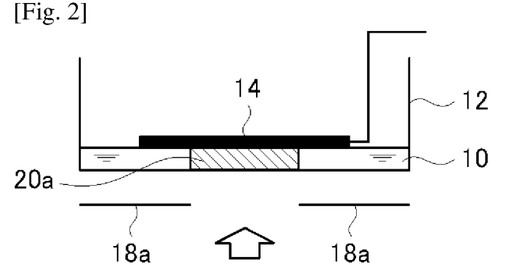
FIG. 2 is a view illustrating a procedure of the step A2 in the three-dimensional object-manufacturing method.

Next, as illustrated in FIG. 2, a mask 18a is provided under the liquid tank 12 based on the shape of a three-dimensional object to be manufactured. As a result of light irradiation from the lower side of the mask 18a, light that was not blocked out by the mask 18a reaches the liquid layer L of the photocurable composition inside the liquid tank 12 to cure the liquid layer L, thus forming a cured layer 20a on the lower surface of the forming stage 14. In other words, the liquid layer L is selectively irradiated with light to form the cured layer 20a (corresponding to the step A2). The cured layer 20a has a thickness of, for example, 1-500 micrometers, and preferably 5-100 micrometers.

The type of light to be used is not particularly limited as long as the light has a wavelength at which the photocurable composition is cured. Examples of the light include ultraviolet light and visible light. Light at 350 nm-400 nm is preferred in terms of the ease of device and optical system construction, and the curability of the liquid layer.

The light source for light irradiation is not particularly limited either, and examples thereof include a light emitting diode (LED), a laser diode (LD), a high pressure mercury lamp, an ultrahigh pressure mercury lamp, a metal halide lamp, a halogen lamp, and a xenon lamp.

Figure 3:
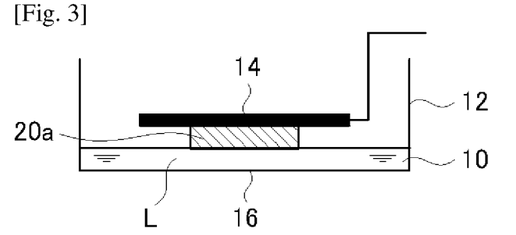
FIG. 3 is a view illustrating a procedure of the step A1 in the three-dimensional object-manufacturing method.

Next, as illustrated in FIG. 3, the forming stage 14 is moved upward by a distance corresponding to one layer (for example, 1-500 micrometers, and preferably 5-100 micrometers) with respect to the bottom surface 16 of the liquid tank 12, and the photocurable composition 10 is introduced under the cured layer 20a to form a new liquid layer L of the photocurable composition 10 between a lower surface of the cured layer 20a and the bottom surface 16 of the liquid tank 12 (corresponding to the step A1).

Figure 4:
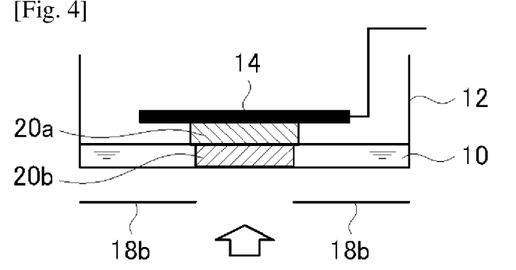
FIG. 4 is a view illustrating a procedure of the step A2 in the three-dimensional object-manufacturing method.

Next, as illustrated in FIG. 4, a mask 18b is provided under the liquid tank 12 based on the shape of the three-dimensional object to be manufactured. As a result of light irradiation from the lower side of the mask 18b, light that was not blocked out by the mask 18b reaches the liquid layer L of the photocurable composition inside the liquid tank 12 to cure the liquid layer L, thus forming a cured layer 20b on the lower side of the cured layer 20a (corresponding to the step A2). The cured layer 20b has a thickness of, for example, 1-500 micrometers, and preferably 5-100 micrometers.

The steps in FIG. 3 and FIG. 4 are subsequently repeated to allow a plurality of cured layers to be integrally stacked to manufacture the three-dimensionally stacked object (three-dimensional object). In other words, a stacked object having a plurality of cured layers stacked on top of each other can be manufactured by repeating the step A1 and the step A2.

The size of the stacked object is not particularly limited, and is on the scale of usually at least 0.5 mm but up to a few meters, and typically a few centimeters to a few tens of centimeters.

The shape of masks used in the above operation can be designed from data of a group of cross-sections obtained by slicing three-dimensional CAD data of a three-dimensional object to be formed into a plurality of layers.

The above description refers to the light irradiation mode from the lower side of the liquid tank. However, this is not the sole mode but light irradiation may be performed from a lateral side or an upper side of the liquid tank. When light irradiation is performed from the upper side of the liquid tank, for example, cured layers are stacked on the upper side of the forming stage, and the stacking operation is therefore repeated by moving the forming stage downward.

Although the light irradiation method using masks has been described above, other methods may be used. For example, a method in which the liquid layer L is selectively irradiated with light while scanning with laser light or convergent light obtained with the use of lenses may be used. Alternatively, light patterned using a digital mirror device or a liquid crystal device may be used for irradiation.

The amount of exposure light for the irradiation of the liquid layer in the step A2 is not particularly limited, and is preferably up to 100 mJ/cm$^2$ and more preferably up to 50 mJ/cm$^2$ in order to prevent curing of an adjacent liquid layer and sticking of a cured product to the bottom surface. The lower limit of the amount of exposure light used for light irradiation is not particularly limited, and is preferably at least 1 mJ/cm$^2$ and more preferably at least 5 mJ/cm$^2$ in terms of the curability of the liquid layer.

<Step B>

When the photocurable composition contains an acylphosphine oxide photopolymerization initiator (specific initiator), the step A is preferably followed by a step B for further performing light irradiation. When the step B is performed, portions colored by the specific initiator are discolored (photobleached) by the photobleaching function of the specific initiator to obtain a three-dimensional object having excellent transparency.

The amount of exposure light in this step is preferably at least 1,000 mJ/cm$^2$, more preferably at least 3,000 mJ/cm$^2$ and even more preferably at least 5,000 mJ/cm$^2$ because the transparency of the resulting three-dimensional object is more excellent. The upper limit is not particularly limited, and is preferably up to 360,000 mJ/cm$^2$ in terms of saturation of the photobleaching function and suppression of photodeterioration of a cured product.

The type of light to be used is not particularly limited as long as the specific initiator is sensitive to the light. Examples of the light include ultraviolet light and visible light, and ultraviolet light is preferred because of more excellent properties. Light at 350 nm-400 nm is particularly preferred in terms of optical transparency of a cured product and absorption ability of the photopolymerization initiator.

The light source for light irradiation is not particularly limited either, and examples thereof include an LED, an LD, a high pressure mercury lamp, an ultrahigh pressure mercury lamp, a metal halide lamp, a halogen lamp, and a xenon lamp.

<Step C>

The step A or B may be optionally followed by a step C for heating the resulting three-dimensional object. The transparency of the three-dimensional object is further improved by performing the step C.

The heating temperature is preferably 50° C. or higher, and more preferably 60° C. or higher. The upper limit is not particularly limited and is preferably 100° C. or lower and more preferably 80° C. or lower in terms of heat resistance of the three-dimensional object.

The heating time is preferably 1-24 hours, and more preferably 3-10 hours.

2. Properties

Preferred refractive index, glass transition point, hardness, and transmittance of the three-dimensional object according to this embodiment are the same as those of a cured product of the composition as described above.

3. Application

The three-dimensional object according to this embodiment finds various applications and is particularly used with advantage for optical elements (preferably for lens (in particular eyeglass lens), and prism).

Especially, the eyeglass lens is a lens which is designed to fit a spectacles frame so as to protect the eye and/or correct the sight and can be an uncorrective (also called plano or afocal lens) or corrective eyeglass lens.

The Corrective eyeglass lens may be a unifocal, a bifocal, a trifocal or a progressive lens.

EXAMPLES

The photocurable composition and the three-dimensional object are described below in further detail with reference to examples and comparative examples, however, should not be construed as being limited to these examples.

1. Preparation of Photocurable Composition

Ingredients shown in Table 1 were mixed at a ratio (wt %) shown in Table 1, and the resulting mixture was heated at 60° C. for 30 minutes to prepare a photocurable composition in each of Examples and Comparative Examples.

2. Evaluation

Each of the resulting photocurable compositions was evaluated as described below.

<Preparation of Cured Product>

Each of the resulting photocurable compositions was used to prepare a cast film. A spot light source LC8 manufactured by Hamamatsu Photonics K.K. was used to subject each surface of the resulting cast film to light irradiation for 1 minute to obtain a cured product having a thickness of 2 mm.

<Refractive Index, Abbe Number>

2010M Prism Coupler manufactured by Metricon Corporation was used to measure the refractive index and Abbe number of the resulting cured product at wavelengths of 473 nm, 594 nm, and 654 nm.

As a result, each of the cured products in Examples 1 and 2 had a refractive index of at least 1.60 at the wavelength of 594 nm. In practical use, the refractive index at the wavelength of 594 nm is preferably at least 1.60, and more preferably at least 1.62. A higher refractive index is preferred.

Table 1 shows specific numerical values of the refractive index and Abbe number in Example 1 and Comparative Example 1.

<Transmittance>

A spectrophotometer U4100 (Hitachi High-Technologies Corporation) was used to measure the transmittance of the cured products in Examples 1 and 2 at wavelengths of 420-800 nm, and the transmittance was at least 85% over the entire measuring wavelength range.

<Viscosity>

A viscometer (VM-10A manufactured by Sekonic Corporation) was used to measure the viscosity (25° C.) of each of the resulting photocurable compositions. The results are shown in Table 1. In practical use, the viscosity is preferably up to 900 mPa·s. A lower viscosity is preferred.

<Hardness>

The Shore D hardness of the cured product in Example 1 as measured with a durometer (HH336 manufactured by Mitutoyo Corporation) was HDD 75.

3. Fabrication of Three-Dimensional Object

The photocurable composition in each of Examples 1 and 2 was used to fabricate a three-dimensional object.

To be more specific, first of all, a commercially available 3D printer having a light source emitting ultraviolet light was used to obtain a stacked object through stereolithography. Stereolithography using the 3D printer was performed by the same procedures as in the above step A as described with reference to FIG. 1 to FIG. 4. In stereolithography, circular cured layers each having a diameter of 20 mm and a thickness of 100 micrometers were repeatedly stacked on top of each other until the stacked object had a thickness of 10 mm.

Next, the resulting stacked object was taken out and subjected to light irradiation (step B). The amount of exposure light used for the light irradiation was 3,000 mJ/cm². Next, the stacked object after the step B was heated at 70° C. for 6 hours to fabricate a three-dimensional object (step C).

The resulting three-dimensional object was evaluated as described above (except the viscosity), and the same results were obtained.

TABLE 1

| | Example 1 | Example 2 | Comparative Example 1 | Comparative Example 2 |
|---|---|---|---|---|
| Fluorene monomer | 39 | 35.5 | 44.8 | 39 |
| Carbazole monomer | 10 | 9.1 | | |
| Diluent monomer 1 | 23 | 20.9 | | |
| Diluent monomer 2 | 26 | 23.6 | 38.7 | 26 |
| Diluent monomer 3 | | 9.1 | | |
| Diluent monomer 4 | | | 14.9 | 24 |
| Photopolymerization initiator 1 | 1 | 0.9 | | 1 |
| Photopolymerization initiator 2 | | | 0.5 | |
| Photopolymerization initiator 3 | | | 1.1 | |
| Crosslinker | 1 | 0.9 | | |
| Additive | | | | 10 |
| Total | 100 | 100 | 100 | 100 |
| C/(F + C) | 20% | 20% | 0% | 0% |
| D/total solids | 49% | 54% | 54% | 50% |
| Refractive index(473 nm) | 1.6395 | | 1.6237 | |
| Refractive index(594 nm) | 1.6215 | | 1.6044 | |

TABLE 1-continued

| | Example 1 | Example 2 | Comparative Example 1 | Comparative Example 2 |
|---|---|---|---|---|
| Refractive index (654 nm) | 1.6131 | | 1.5985 | |
| Abbe number | 24.8 | | 26.76 | |
| Transmittance | 85% | 85% | | |
| Viscosity [mPa · s] | 190 | 244 | 2320 | 923 |
| Hardness | HDD75 | | | |

Details of the respective ingredients shown in Table 1 above are as follows:

Fluorene monomer: 9,9-Bis[4-(2-acryloyloxyethoxy)phenyl]fluorene (its structural formula is shown below)

Carbazole monomer: 9-Vinylcarbazole (its structural formula is shown below)

Diluent monomer 1: Benzyl acrylate (its structural formula is shown below) (refractive index: 1.519; viscosity: 2 mPa·s)

Diluent monomer 2: Ethoxylated o-phenylphenol acrylate (its structural formula is shown below; n is approximately equal to 1-2) (refractive index: 1.57; viscosity: 125 mPa·s)

Diluent monomer 3: 2-Hydroxy-4-phenoxypropyl acrylate (HPPA) (its structural formula is shown below) (refractive index: 1.526; viscosity: 150-200 mPa·s)

Diluent monomer 4: Isobornyl acrylate (its structural formula is shown below) (refractive index: 1.47; viscosity: 7 mPa·s)

Photopolymerization initiator 1: IRGACURE TPO
Photopolymerization initiator 2: IRGACURE 184
Photopolymerization initiator 3: DETX (2,4-diethyl-9H-thioxanthen-9-one) (its structural formula is shown below)

Crosslinker: Trimethylolpropane triacrylate
Additive: Benzoquinoline

In Table 1, "Total" represents the sum (wt %) of the respective ingredients. "C/(F+C)" and "D/total solids" represent the above-mentioned C/(F+C) and D/(total solids), respectively.

In the photocurable compositions in Examples 1 and 2 each having contained the fluorene monomer, the carbazole monomer, and the diluent monomer at a specified weight ratio, the viscosity was low, and the resulting cured products were high in refractive index.

In contrast, the viscosity was high in the photocurable compositions in Comparative Examples 1 and 2 that contained no carbazole monomer.

Stereolithography was applied to the photocurable compositions in Examples 1 and 2 as described above, and as a result, three-dimensional objects having a high refractive index could be fabricated.

The three-dimensional object that could be fabricated in Example 2 in which the compound (1) and the compound (2) as described below were contained as the diluent monomers was more adhesive and tougher than the three-dimensional object in Example 1 in which the compound (1) described below was only contained as the diluent monomer.

Compound (1): the above-mentioned compound represented by formula (D1) (when no substituent is included).

Compound (2): the above-mentioned compound represented by formula (D1) (when a hydroxy group is included as the substituent).

REFERENCE SIGNS LIST 10 photocurable composition
12 liquid tank
14 forming stage
16 bottom surface
18a, 18b mask
20a, 20b cured layer
L liquid layer

The invention claimed is:

1. A photocurable composition for three-dimensional stereolithography comprising:
   a fluorene monomer;
   a carbazole monomer;
   a diluent monomer; and
   a photopolymerization initiator,
   wherein the carbazole monomer is contained in an amount in a range of 5 to 25 wt % with respect to a total amount of the fluorene monomer and the carbazole monomer, and
   the diluent monomer is contained in an amount of at least 20 wt % with respect to total solids.

2. The photocurable composition for three-dimensional stereolithography according to claim 1, wherein the fluorene monomer and the carbazole monomer are contained in a total amount of 30-80 wt % with respect to total monomers.

3. The photocurable composition for three-dimensional stereolithography according to claim 1, wherein the diluent monomer has a refractive index of at least 1.47.

4. The photocurable composition for three-dimensional stereolithography according to claim 1, wherein the diluent monomer has a viscosity of up to 500 mPa·s.

5. The photocurable composition for three-dimensional stereolithography according to claim 1, wherein the diluent monomer contains:
   a compound (1) as a compound represented by formula (D1) provided that no substituent is included, and
   a compound (2) as a compound represented by formula (D1) provided that a hydroxy group is included as a substituent,
   with formula (D1) being:
   W-L-P (D1)
   where, in formula (D1), W represents an alicyclic hydrocarbon group or an aromatic hydrocarbon group, provided that fluorenyl group is not included, L represents a single bond or a divalent linking group, P represents a polymerizable group, and W, L, and P may each have a substituent.

6. The photocurable composition for three-dimensional stereolithography according to claim 1, having a viscosity of up to 900 mPa·s.

7. The photocurable composition for three-dimensional stereolithography according to claim 1, having, when cured, a transmittance of at least 85%.

8. A three-dimensional object formed by using the photocurable composition for three-dimensional stereolithography according to claim 7.

9. The three-dimensional object according to claim 8, being an optical element.

10. The photocurable composition for three-dimensional stereolithography according to claim 1, wherein the carbazole monomer is contained in an amount in a range of 10 to 25 wt % with respect to the total amount of the fluorene monomer and the carbazole monomer.

11. The photocurable composition for three-dimensional stereolithography according to claim 1, wherein the carbazole monomer is contained in an amount in a range of 15 to 25 wt % with respect to the total amount of the fluorene monomer and the carbazole monomer.

12. The photocurable composition for three-dimensional stereolithography according to claim 1, wherein the carbazole monomer is contained in an amount in a range of 5 to 15 wt % with respect to the total amount of the fluorene monomer and the carbazole monomer.

13. The photocurable composition for three-dimensional stereolithography according to claim 1, wherein the diluent monomer is contained in an amount in a range of 20 to 90 wt % with respect to total solids.

14. The photocurable composition for three-dimensional stereolithography according to claim 1, wherein the diluent monomer is contained in an amount in a range of 20 to 80 wt % with respect to total solids.

15. The photocurable composition for three-dimensional stereolithography according to claim 1, wherein the diluent monomer is contained in an amount in a range of 40 to 70 wt % with respect to total solids.

16. The photocurable composition for three-dimensional stereolithography according to claim 1, wherein the diluent monomer is contained in an amount in a range of 44 to 60 wt % with respect to total solids.

17. The photocurable composition for three-dimensional stereolithography according to claim 1, wherein the carbazole monomer includes at least one polymerizable group.

18. The photocurable composition for three-dimensional stereolithography according to claim 1, wherein the total solids includes all ingredients excluding solvents other than an alcohol used as an anti-yellowing agent.

* * * * *